United States Patent
Nagaraj et al.

(10) Patent No.: US 8,280,331 B2
(45) Date of Patent: Oct. 2, 2012

(54) SYSTEM AND METHOD FOR TUNING FM SYNTHESIZER

(75) Inventors: Krishnasawamy Nagaraj, Plano, TX (US); Neeraj Nayak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 471 days.

(21) Appl. No.: 12/617,124

(22) Filed: Nov. 12, 2009

(65) Prior Publication Data

US 2010/0119011 A1    May 13, 2010

Related U.S. Application Data

(60) Provisional application No. 61/113,648, filed on Nov. 12, 2008.

(51) Int. Cl.
*H04B 1/06* (2006.01)
(52) U.S. Cl. ........ 455/260; 455/255; 455/258; 455/318; 455/112; 455/216; 375/376
(58) Field of Classification Search .................. 455/205, 455/75–76, 112, 165.1, 139–141, 180.3, 455/183.1, 196.1, 207–209, 216, 255–260, 455/265, 313, 315, 316, 318; 375/376, 324–328, 375/346, 349; 327/147, 156, 159, 536
See application file for complete search history.

(56) References Cited

U.S. PATENT DOCUMENTS

| | | | |
|---|---|---|---|
| 6,757,054 B2 * | 6/2004 | Watanabe et al. | 356/5.1 |
| 7,058,120 B1 * | 6/2006 | Lu et al. | 375/214 |
| 7,170,965 B2 * | 1/2007 | Chien | 375/376 |
| 7,567,106 B2 * | 7/2009 | Park et al. | 327/175 |
| 7,659,783 B2 * | 2/2010 | Tai | 331/17 |
| 2010/0120390 A1 * | 5/2010 | Panikkath et al. | 455/208 |
| 2011/0234266 A1 * | 9/2011 | Tsai | 327/115 |
| 2012/0001666 A1 * | 1/2012 | Brown et al. | 327/118 |
| 2012/0081163 A1 * | 4/2012 | Hesen et al. | 327/175 |

* cited by examiner

*Primary Examiner* — Pablo Tran
(74) *Attorney, Agent, or Firm* — John R. Pessetto; W. James Brady; Frederick J. Telecky, Jr.

(57) ABSTRACT

A device is provided for dividing a clock signal by even and odd integers. The device includes a divider, a delay portion and a duty cycle corrector. The divider is arranged to receive the clock signal and can divide the clock signal and output a divided clock signal. The delay portion can output a delayed signal based on the divided clock signal. The duty cycle corrector can output a first signal based on the delayed signal and the divided clock signal.

15 Claims, 6 Drawing Sheets

SYSTEM AND METHOD FOR TUNING FM SYNTHESIZER

The present application claims priority from U.S. Provisional Application No. 61/113,648 filed Nov. 12, 2008, the entire disclosure of which is incorporated herein by reference.

BACKGROUND

A conventional receiver receives radio frequency signals and attenuates noise from the received radio frequency signals so that a desired signal can be converted for the use of video, voice, or data. Conventional receivers are used in military, wireless, satellite communications, microwave and other technologies. From an antenna, a conventional receiver is tuned to extract the desired radio signal. The transmitted signal will have been modulated in one of several ways, for instance, amplitude modulation (AM) or frequency modulation (FM). A conventional FM receiver will now be described below with reference to FIG. 1.

FIG. 1 illustrates a conventional FM receiver 100. Receiver 100 includes an RF front end 104, a mixer 106, an FM synthesizer 108, an automatic gain controller (AGC) 118, an AGC 120, an analog to digital convertor (ADC) 122, an ADC 124 and a digital signal processor 126. Mixer 106 includes a multiplier 114 and a multiplier 116.

RF front end 104 is arranged to receive an analog signal 101 and output a conditioned RF signal 105. Mixer 106 is arranged to receive conditioned RF signal 105 and mix conditioned RF signal 105 with a frequency of interest generated by FM synthesizer 108, as will be discussed further in FIG. 2. FM synthesizer 108 generates in-phase 111 and quadrature-phase 113 clock signals of a desired frequency.

Mixer 106 multiplies conditioned RF signal 105 by I-signal 111 via multiplier 114 and outputs a mixed I-signal 115. Similarly, mixer 106 multiplies conditioned RF signal 105 by Q-signal 113 via multiplier 116 and outputs a mixed Q-signal 117.

AGC 118 and ADC 122 make up an I-signal leg of conventional receiver 100, whereas AGC 120 and ADC 124 make up a Q-signal leg of conventional receiver 100.

In particular, AGC 118 is arranged to receive and scale, i.e., amplify or attenuate as predetermined by design, mixed I-signal 115. AGC 118 is then operable to output a scaled I output signal 119. Similarly, AGC 120 is arranged to receive and scale, i.e., amplify or attenuate as predetermined by design, mixed Q-signal 113. AGC 120 is then operable to output a scaled Q output signal 121.

ADC 122 converts scaled I output signal 119 to digital signal 123. Q ADC 124 converts scaled Q output signal 121 to Q digital signal 125. I digital signal 123 and Q digital signal 125 are then received by digital signal processor 126.

In FM receiver 100, analog signal 101 is typically in the megahertz range, known as a channel, whereas the actual information to be processed by DSP 126 is in the kilohertz range. Mixer 106 down-converts analog signal 101 into the kilohertz range as mixed I-signal 115 and mixed Q-signal 117 by using a clock from a local oscillator, such that ADC 122 (and ADC 124) and DSP 126 may process the signals. In this case, the local oscillator is synthesizer 108. Synthesizer 108 is operable to generate I-signal 111 and Q-signal 113, wherein each is tunable within a predetermined band, as will be described in greater detail below. Conventionally, synthesizer 108 should be able to output signals having frequencies within a band from 65 MHz to 108 MHz, in 50 kHz steps.

Operation of synthesizer 108 will now be described in more detail with reference to FIG. 2.

FIG. 2 is a more detailed view of FM synthesizer 108 of FIG. 1. FM synthesizer 108 includes an input clock reference signal divider 202, a frequency comparator 204, an amplifier 208, a digital filter 210, a digitally controlled oscillator (DCO) 212 and an output divider 214.

Input clock reference signal divider 202 is arranged to receive an input clock reference signal 201 and output a divided reference signal 203. Frequency comparator 204 is arranged to receive I-signal 111, divided reference signal 203, channel ID signal 205 and to output a digital error signal 207. Amplifier 208 is arranged to receive digital error signal 207 and output a scaled digital error signal 209. Digital filter 210 is arranged to receive scaled digital error signal 209 and output a control signal 211. DCO 212 is arranged to receive control signal 211 and output a clock signal 213 of desired frequency. Output divider 214 is arranged to receive clock signal 213 from DCO 212 and output I-signal 111 and Q-signal 113. Each of I-signal 111 and Q-signal 113 are an integer divided version of clock signal 213. Operation of FM synthesizer 108 will now be described in more detail.

In operation, input clock reference signal divider 202 receives input clock reference signal 201. Input clock reference signal divider 202 then divides input clock reference signal 201 by a predetermined integer N in order to step down the frequency of input clock reference signal 201 and output divided reference signal 203.

Frequency comparator 204 compares I signal 111 and divided reference signal 203, with reference to channel ID signal 205. For example, if it is desired that the I-signal 111 to be 100 times the divided reference signal 203, then channel ID signal 205 may be one hundred (100), whereas if it is desired for I-signal 111 to be 50 times larger than divided reference signal 203, then channel ID signal 205 may be fifty (50), and so on.

The difference between I-signal 111 and divided reference signal 203, with reference to channel ID signal 205, is output digital error signal 207. For example, if channel ID signal 205 is one hundred (100), then digital error signal 207 will be equal to the difference between divided reference signal 203 and I-signal 111 minus one hundred, whereas if channel ID signal 205 is fifty (50) then digital error signal 207 will be equal to the difference between divided reference signal 203 and I-signal 111 minus fifty.

Amplifier 208 scales digital error signal 207 by a predetermined gain β to generate scaled digital error signal 209. Digital filter 210 then filters amplified digital error signal 209 to generate control signal 211. Control signal 211 is then fed into DCO 212 to generate output clock signal 213. Output divider 214 divides output clock signal 213 by a predetermined integer, K, as will be described in more detail below. Accordingly, output divider 214 outputs I-signal 111 and Q-signal 113, each of which is a divided-by-K version of output clock signal 213.

DCO 212 is adjusted, or tuned, to produce and maintain a predetermined relationship between input clock reference signal 201 and I-signal 111. Typically, DCO 212 is tuned by a tuning capacitor (not shown) therein. A tuning capacitor may take the form of an addressable bank of capacitors, wherein accessing an increased number of capacitors in the bank will increase the overall capacitance of the tuning capacitor and wherein accessing a decreased number of capacitors in the bank will decrease the overall capacitance of the tuning capacitor. By adjusting the capacitance of the tuning capacitor, the frequency of output clock signal 213 may be adjusted. This will now be described in more detail.

In operation, frequency comparator 204 compares the relationship between the frequency of reference divided signal 203 and the frequency of I-signal 111, with reference to channel ID signal 205. Depending on the difference, frequency comparator 204 then outputs digital error signal 207 as either a positive signal or a negative signal. A negative digital error signal 207 ultimately causes control signal 211 to increase the capacitance of the tuning capacitor within DCO 212. A positive digital error signal 207 ultimately causes control signal 211 to decrease the capacitance of the tuning capacitor within DCO 212. As the capacitance of the tuning capacitor within DCO 212 decreased or increased, DCO 212 responds by increasing or decreasing the frequency of output clock signal 213. The relationship between the frequency of divided reference signal 203 and the frequency of I-signal 111, with reference to channel ID signal 205, is again compared and the cycle repeats. In this manner, the frequency of I-signal 111 is repeatedly adjusted to eventually correspond to divided reference signal 203, with reference to channel ID signal 205. A description of operation of synthesizer 108 by way of an example will now follow.

In synthesizer 108, channel ID signal 205 is set in frequency comparator 204, integer N is set in input clock reference signal divider 202, and integer K is set in output divider 214. After receiving input clock reference signal 201, DCO 212 outputs output clock signal 213. Suppose in this example, that output clock signal 213 is too fast, i.e., the frequency of output clock signal 213 is higher than expected. Frequency comparator 203 compares I-signal 111 with divided reference signal 203, with reference to channel ID signal 205. At this point, because output clock signal 213 does not have the desired frequency as compared to input clock reference signal 201, I-signal 111 will be different from divided reference signal 203, with reference to channel ID signal 205. This difference manifests as a positive digital error signal 207.

Positive digital error signal 207 ultimately causes control signal 211 to change the capacitance of the tuning capacitor within DCO 212 to slow down output clock signal 213. Such a feed-back control loop enables output clock signal 213 to have an accurate frequency such that I-signal 111 has the appropriate relationship, based on channel ID signal 205, with to divided reference signal 203.

Once the frequency of I-signal 111 appropriately corresponds to divided reference signal 203, with reference to channel ID signal 205, synthesizer is considered to be in the "locked" state, and mainly functions to maintain I-signal 111 as "locked" to that of divided reference signal 203.

Output divider 214 receives output clock signal 213 with frequency, $f_{clock}$, and produces I-signal 111 with frequency $f_{out}$, where $f_{out}=f_{clock}/K$, and K is an integer.

The range of DCO 212 is a function of a tuning network therein (not shown), often comprised of a bank of capacitors. As the required frequency range of DCO 212 increases, the corresponding range of the capacitors must increase, which can lead to significant challenges due to parasitic capacitance. Specifically, multiple values of the divisor K are used in conjunction with the range of DCO 212 to represent the entire range of frequencies that can be generated by FM synthesizer 108. In general, if more values of K are supported, then the range requirement of DCO 212 is reduced.

An example tuning output of FM synthesizer 108 will now be described in more detail with reference to FIG. 3.

A typical tuning range for FM synthesizer 108 may be 65 to 110 MHz as shown in FIG. 3. The tuning range of DCO 212 may be 800 to 1000 MHz and output divider 214 is capable of dividing at integers 8, 10, 12, and 14. For an integer divider of 14, FM synthesizer 108 is capable of outputting frequencies in frequency band 302 (800 MHz/14=57.14 MHz to 1000 MHz/14=71.43 MHz). For an integer divider of 12, FM synthesizer 108 is capable of outputting frequencies in frequency band 304 (800 MHz/12=66.67 MHz to 1000 MHz/12=83.33 MHz). For an integer divider of 10, FM synthesizer 108 is capable of outputting frequencies in frequency band 306 (800 MHz/10=80 MHz to 1000 MHz/10=100 MHz). For an integer divider of 8, FM synthesizer 108 is capable of outputting frequencies in frequency band 308 (800 MHz/8=100 MHz to 1000 MHz/8=125 MHz).

FM synthesizer 108 is therefore able to output any frequency from 65 to 110 MHz using a combination of variation of DCO 212 and frequency divider 214. Output in frequency band 310 (65 to 71 MHz) may use an integer divider of 14. Output in frequency band 312 (71 to 83 MHz) may use an integer divider of 12. Output in frequency band 314 (83 to 100 MHz) may use an integer divider of 10. Output in frequency band 316 (100 to 110 MHz) may use an integer divider of 8. The maximum range of frequencies required by DCO 212 is 800 to 1000 MHz, which requires a capacitance change of about 40% when, upon a change in required output frequency of FM synthesizer 108, the output frequency of DCO 212 must change from 800 MHz to 1000 MHz or 1000 MHz to 800 MHz.

Operation of feedback output-divider 214 will now be described in more detail with reference to FIG. 4.

FIG. 4 illustrates example waveforms of output divider 214, wherein integer K dividend value of output divider 214 is eight (8) and the frequency of output clock signal 213 is one gigahertz. In such a case, I-signal 111 and Q-signal 113 will have a frequency of 1000/8, which is 125 megahertz. The figure illustrates a first waveform 402 corresponding to output clock signal 213, a second waveform 404 corresponding to output I-signal 111, and a third waveform 406 corresponding to output Q-signal 113.

In this example, as the integer K dividend value of output divider 214 is eight (8). Starting at T1, there are eight cycles in waveform 402 for one full cycle of waveform 404 ending at T4. Waveform 406 is also composed of eight cycles of waveform 302, from T3 to T5. Further, waveform 406 is delayed by an amount equal to two cycles of waveform 402, from T1 to T3. Both Q-signal 113 and I-signal 111 have a duty cycle of 50 percent when a value of eight is used for the feedback divisor because for a given set of eight clock cycles, DCO 212 is high for four clock cycles of waveform 402 and low for four clock cycles of waveform 402.

In the case where output clock signal 213 is one gigahertz (a period of one nanosecond) and the integer K dividend value of output divider 214 is eight (8), the period of waveform 404 is eight nanoseconds. A 90 degree phase shift is induced in I-signal 111 resulting in Q-signal 113 delayed by 2 nanoseconds (2 clock cycles in waveform 402) or (8 nanoseconds*90 degree/360 degree). The resulting duty cycle of I-signal 111 and Q-signal 113 is 50 percent, given that a period of I-signal 111 and Q-signal 113 is eight nanoseconds, with four nanoseconds being high and four nanoseconds being low.

A conventional method of generating I-signal 111 and Q-signal 113 is to restrict the integer K dividend value of output divider 214 to even integers. Output divider 214 is then organized to first divide $f_{clock}$ by K/2, to generate a frequency $2f_{out}$. This output and it's complement are divide by 2 using two separate dividers to generate I-signal 111 and Q-signal 113 in a simple manner.

In the above mentioned example, this method restricts output divider 214 to values of 8, 10, 12, or 14, where DCO 212 is one gigahertz and when divided gives the desired range of frequencies, 71 to 125 MHz (1000/8 equals 125 and 1000/14 equals ~71.5). Thus, for a given even K value for output divider 214, DCO 212 has a tuning range of at most 20 percent. For example, when K is 8 and DCO 212 is 1000 MHz, the output of output divider 214 is 125 MHz. When K is 10 and DCO 212 is 1000 MHz, the output of output divider is 100 MHz. Therefore given a static value of K (either 8 or 10), for all required frequencies from 125 MHz to 100 MHz, DCO 212 will have to adjust up to 20%. In order to achieve such a wide tuning range, a tuning network composed of capacitors would have to be varied by up to 40 percent. This is very difficult to implement because of parasitic capacitance in DCO 212.

What is needed is a method of reducing the required range of output frequencies of DCO 212 thereby reducing or in order to reduce the required change in capacitance when adjusting DCO 212 from maximum to minimum output frequency.

BRIEF SUMMARY

It is an aspect of the present invention to reduce the tuning range of a DCO thereby reducing or in order to reduce the required change in capacitance when adjusting the DCO by increasing the capability of a frequency divider.

In accordance with an aspect of the present invention, a device and method may be used to divide a clock signal by both even and odd integers. The device includes a divider, a delay portion and a duty cycle corrector. The divider is arranged to receive the clock signal and can divide the clock signal and output a divided clock signal. The delay portion can output a delayed signal based on the divided clock signal. The duty cycle corrector can output a first signal based on the delayed signal and the divided clock signal.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, an output processor addresses the challenges associated with generating the necessary synthesizer output clock signals. This is accomplished by utilizing both even and odd divisors, expanding the output range of the output divider 214, while minimizing the tuning range needed for DCO 212.

Aspects in accordance to the present invention will now be described below with reference to FIG. 5 through FIG. 7.

Figure 5:
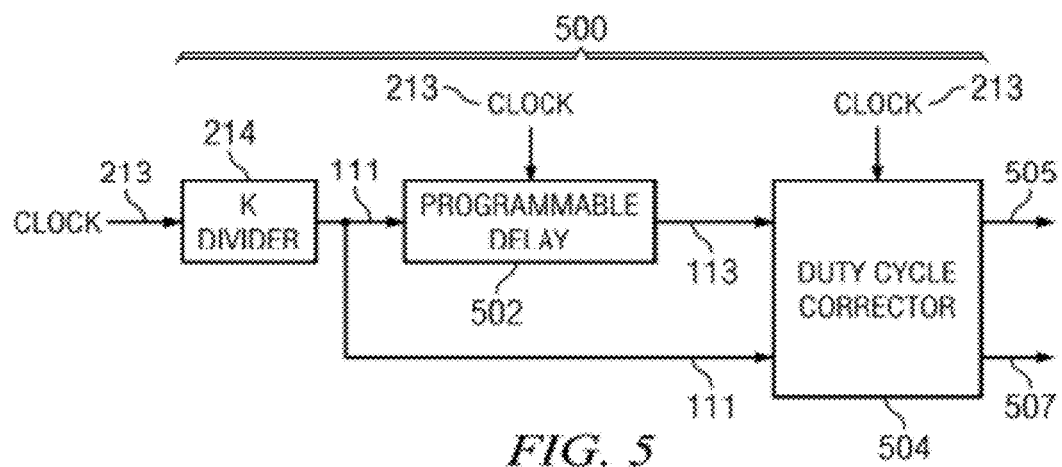
FIG. 5 illustrates an example output divider in accordance with an aspect of the present invention.

FIG. 5 illustrates an output processor 500, in accordance with an aspect of the present invention.

Output processor 500 includes output divider 214, a programmable delay 502 and a duty cycle corrector 504.

Output divider 214 is arranged to receive output clock signal 213 and to output I-signal 111. Programmable delay 502 is arranged to receive output clock signal 213 and I-signal 111 and to output a delayed Q-signal 113. Duty cycle corrector 504 is arranged to receive I-signal 111 and Q-signal 113 and to output corrected Q-signal 505 and corrected I-signal 507.

Q-signal 113 and I-signal 111 are corrected, in accordance with the present invention, by duty cycle corrector 504. The result is corrected Q-signal 505 and corrected I-signal 507 having a duty cycle of fifty percent, to be discussed in further detail in FIG. 6.

The purpose of programmable delay 502 within output divider 214 is to generate the appropriate Q-signal 113 when both even and odd divisors are used. The function of duty cycle corrector 504 is to receive a clock signal(s) 111(113) with a duty cycle other than 50 percent, and output a corrected clock signals, made up of corrected Q-signal 505 and corrected I-signal 507, with a duty cycle of 50%.

In operation, I-signal 111 is delayed by a one quarter of the $f_{out}$ period by the programmable delay 502 with an allowable deviation of less than or equal to one half of one clock cycle of output clock signal 213. This results in a Q-signal that is very close to being in quadrature with respect to the I-signal. If the K value is even then output divider 214 automatically generates a 50% duty cycle output and duty cycle corrector 504 is bypassed. For odd divide ratios, output divider 214 generates a signal that has a duty cycle deviation (from 50%) of one $f_{clock}$ period. For example, if K=11, the output from output divider 214 will be "On" for 6 $f_{clock}$ periods and "Off" for 5 $f_{clock}$ periods. Duty cycle corrector 504 adjusts I-signal 111 and Q-signal 113 to have a duty cycle 50 percent.

Operation of the duty cycle corrector 504 will now be described in more detail below with reference to FIG. 6.

Figure 6:
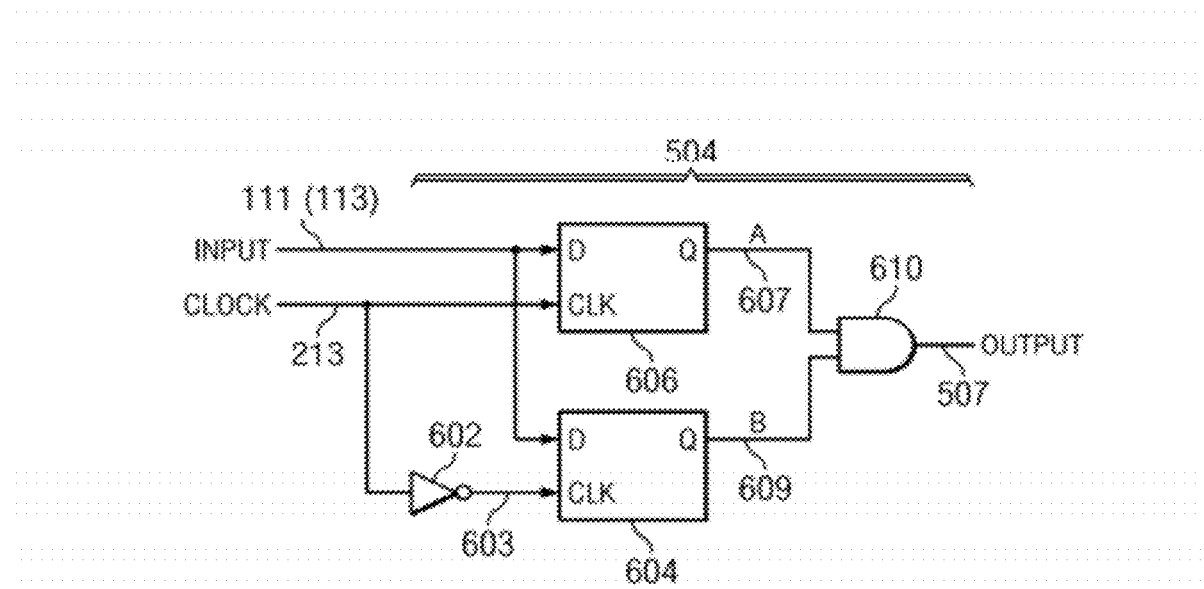
FIG. 6 illustrates an example duty cycle corrector in accordance with an aspect of the present invention.

For the purpose of simplicity, FIG. 6 illustrates the arrangement of an example duty cycle corrector 504 in order to process a single signal, I-signal 111. However, it should be noted that duty cycle corrector 504 additionally processes Q-signal 113.

FIG. 6 includes an inverter 602, a half unit delay 604, a unit delay 606 and a logic gate AND 610.

Inverter 602 is arranged to receive output clock signal 213 and to output an inverted clock signal 603. Half unit delay 604 is arranged to receive I-signal 111 and output clock signal 213 and to output a unit delayed signal 607. Unit delay 606 is arranged to receive I-signal 111 and inverted clock signal 603 and to output a half unit delayed signal 609. Logic gate AND 610 is arranged to receive unit delayed signal 607 and half unit delayed signal 609 and to output corrected I-signal 507.

In accordance with the present invention, FIG. 5 illustrates the modification of input I-signal 111 to have a 50 percent duty cycle as defined by output clock signal 213. Output clock signal 213 is fed into inverter 602 which results in inverted clock signal 603. Half unit delay 604 then delays I-signal 111 as a function of inverted clock signal 603 resulting in half unit delayed signal 609.

In unit delay 606, I-signal 111 is delayed as a function of output clock signal 213. This results in unit delayed signal 607. Unit delayed signal 607 and half unit delayed signal 609 are then fed into logic gate AND 610. The result is one signal, corrected I-signal 507, with a duty cycle of 50 percent.

In operation, when the divide ratio is odd and the desired duty cycle is 50 percent with deviation of only one cycle of output clock signal 213, I-signal 111 is phase shifted by one full cycle and one half cycle of output clock signal 213. I-signal 111 is then represented by unit delayed signal 607 and half unit delayed signal 609. Unit delayed signal 607 and half unit delayed signal 609 are "ANDed" in logic "AND" gate 610. The corrected I-signal 507 has it's "On" time shortened by one half cycle of output clock signal 213. This is demonstrated in the waveforms in FIG. 7

Figure 7:
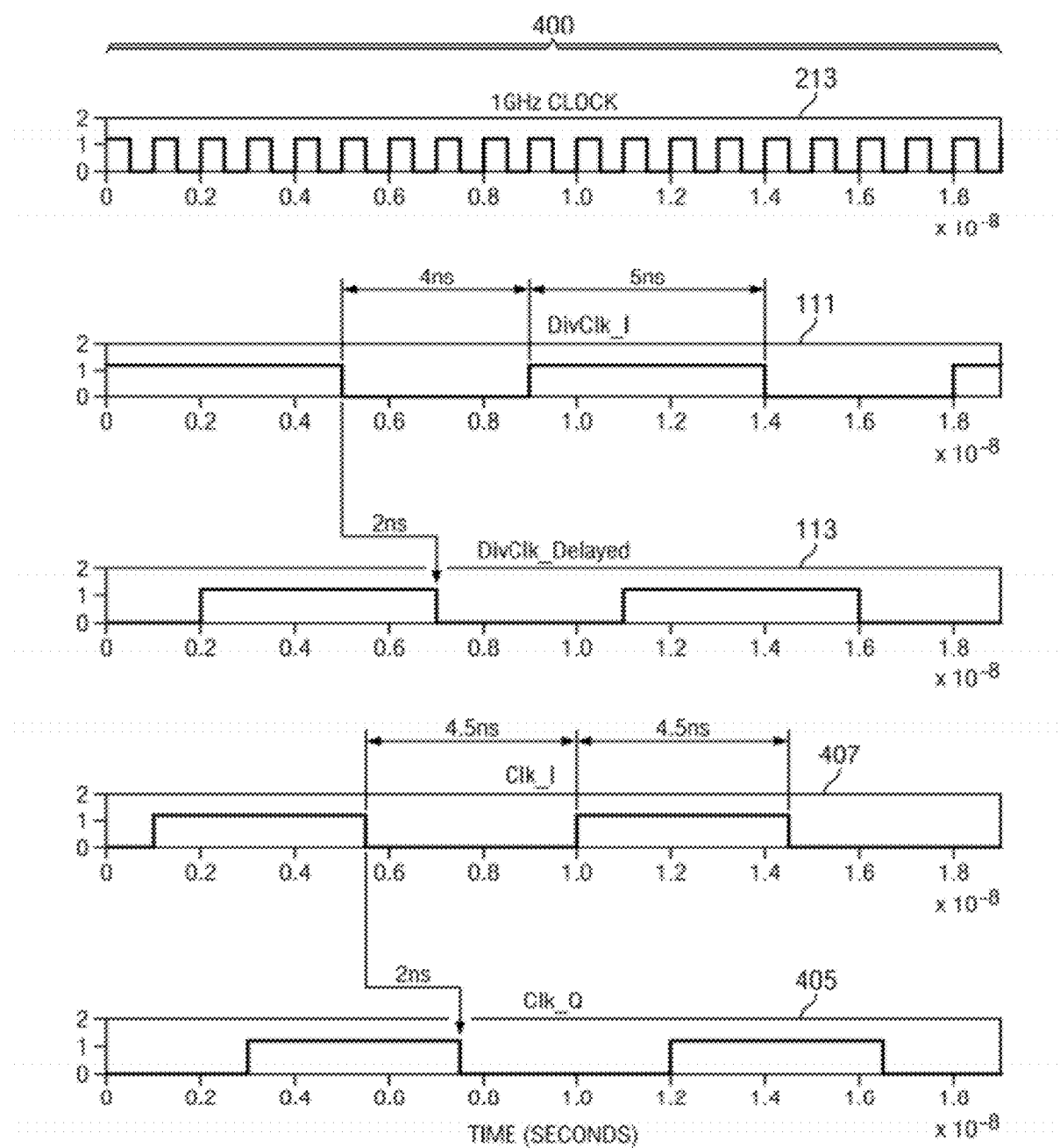
FIG. 7 illustrates example waveforms associated with the output divider of FIG. 5.

FIG. 7 includes exemplary waveforms of output divider 500, with a divider value of nine.

In FIG. 7, output divider 500 is arranged to receive I-signal 111, Q-signal 113 and output clock signal 213. The output signals are corrected Q-signal 505 and corrected I-signal 507.

In accordance with an aspect of the present invention, I-signal 111 is delayed by two clock cycles of output clock signal 213, by programmable delay 502. This generates Q-signal 113. Ideally Q-signal 113 should lag I-signal 111 by 9/4 (or 2.25) output clock cycles. In this example implementation, Q-signal 113 lags I-signal 111 by 2 output clock cycles. Given that I-signal III and Q-signal have a duty cycle greater than 50 percent, complex signal 111(113) then enter duty cycle corrector 504. The resulting output of duty cycle corrector 504 is corrected O-signal 505 and corrected I-signal 507, each having a duty cycle of 50 percent.

In operation, when output divider 500 utilizes nine as a divisor, the resulting duty cycle of I-signal 111 and Q-signal 113 is 55 percent (four output clock cycles low, five output clock cycles high). I-signal 111 and Q-signal 113 must then enter duty cycle corrector 504 in order that they may have a corrected duty cycle of 50 percent (four and a half output clock cycles low, four and a half output clock cycles high). This is accomplished within duty cycle corrector 504, as described previously with reference to FIG. 6.

In operation where the divider value is nine, the ideal delay between I-signal 111 and Q-signal 113 is 9*90/360 (or 2.25) output clock cycles. However, this implementation delays Q-signal 113 by only two output clock cycles resulting in a phase delay of (2)*360/9=80 degrees. The residual error (90−80=10 degrees of phase) is corrected by digital signal processor 126.

Tuning output of FM synthesizer 108 will now be described in more detail with reference to FIG. 8.

Figure 8:
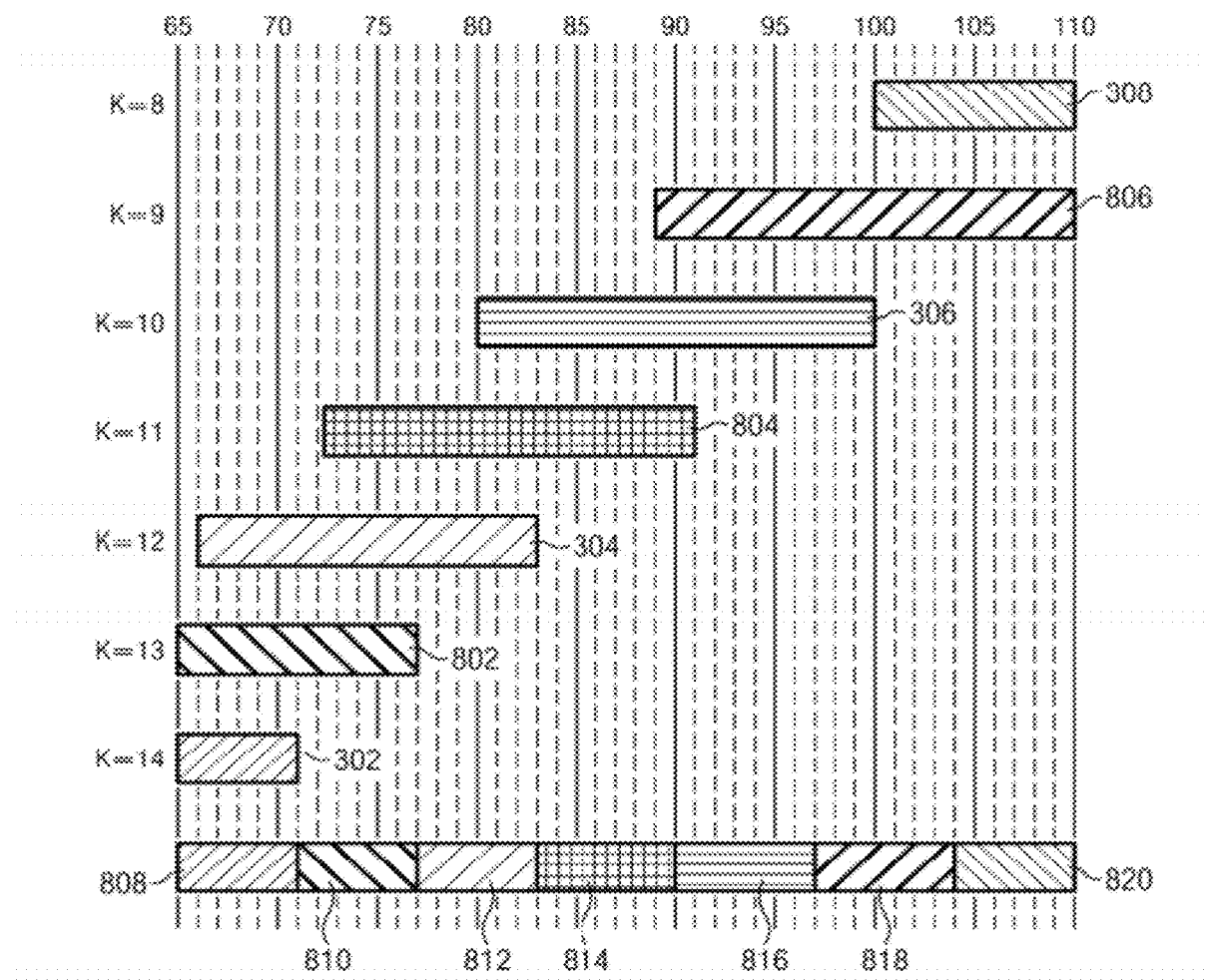
FIG. 8 illustrates the tuning output of a FM synthesizer in accordance with an aspect of the present invention.

A typical tuning range for FM synthesizer 108 may be 65 to 110 MHz as shown in FIG. 8. The tuning range of DCO 212 may be 900 to 1000 MHz and output divider 500 is capable of dividing at integers 9, 10, 11, 12, 13, and 14. With an integer divider of 14, FM synthesizer 108 is capable of outputting frequencies in frequency band 302 (900 MHz/14=64.3 MHz to 1000 MHz/14=71.43 MHz). With an integer divider of 13, FM synthesizer 108 is capable of outputting frequencies in frequency band 802 (900 MHz/13=69.23 MHz to 1000 MHz/12=76.92 MHz). With an integer divider of 12, FM synthesizer 108 is capable of outputting frequencies in frequency band 304 (900 MHz/12=75 MHz to 1000 MHz/12=83.33 MHz). With an integer divider of 11, FM synthesizer 108 is capable of outputting frequencies in frequency band 804 (900 MHz/11=81.8 MHz to 1000 MHz/12=90.91 MHz). With an integer divider of 10, FM synthesizer 108 is capable of outputting frequencies in frequency band 306 (900 MHz/10=90 MHz to 1000 MHz/10=100 MHz). With an integer divider of 9, FM synthesizer 108 is capable of outputting frequencies in frequency band 806 (900 MHz/9=100 MHz to 1000 MHz/9=111 MHz). FM synthesizer 108 is therefore capable to output any frequency from 65 to 110 MHz using a combination of variation of DCO 212 and frequency divider 500.

Figure 1:
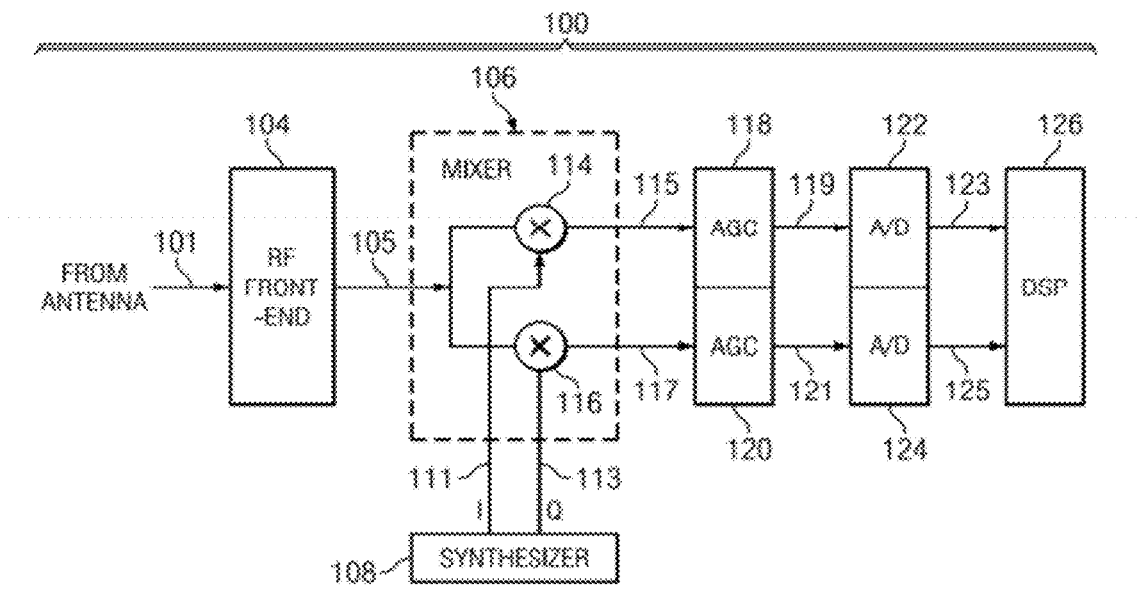
FIG. 1 illustrates a conventional receiver.
Figure 2:
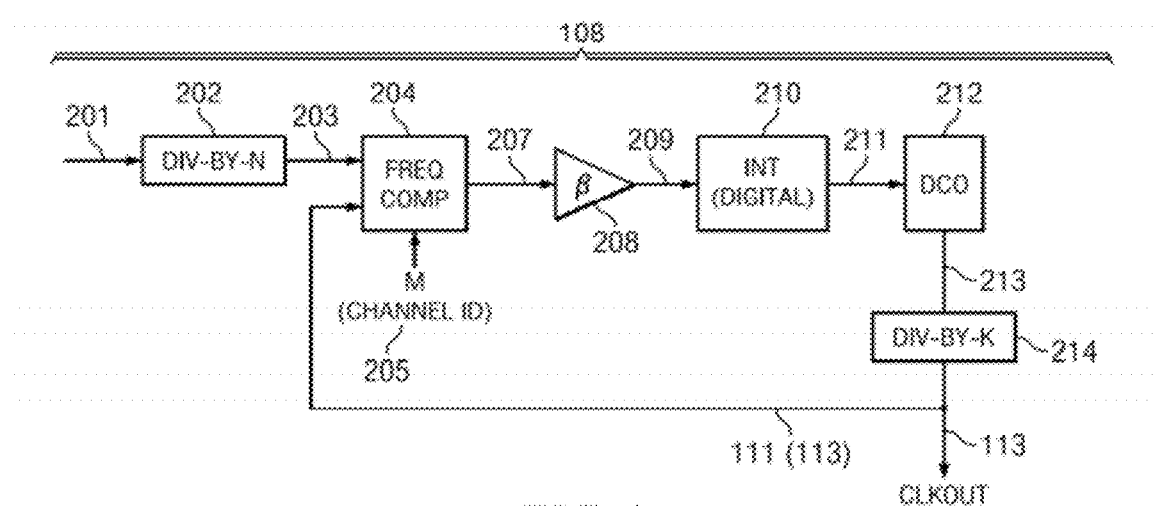
FIG. 2 illustrates a conventional FM Synthesizer.
Figure 3:
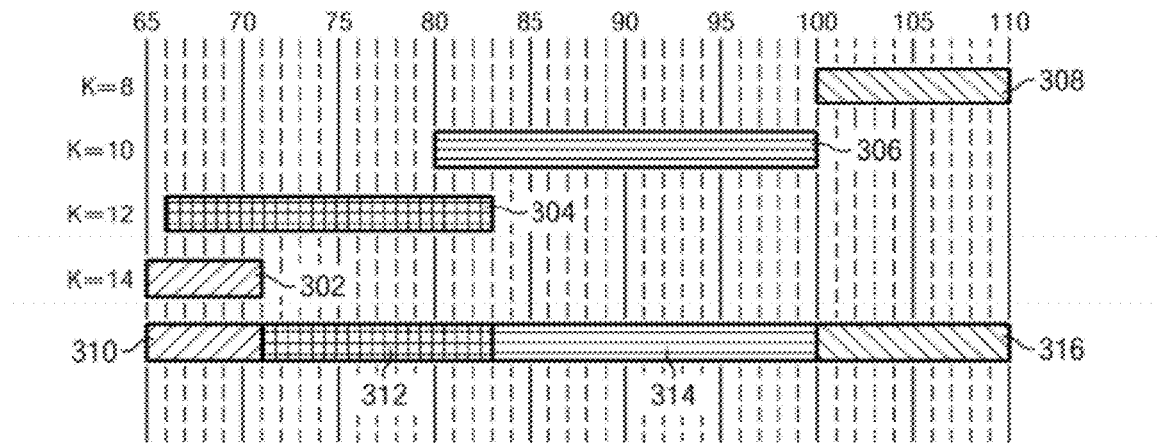
FIG. 3 illustrates the tuning output of a conventional FM synthesizer.
Figure 4:
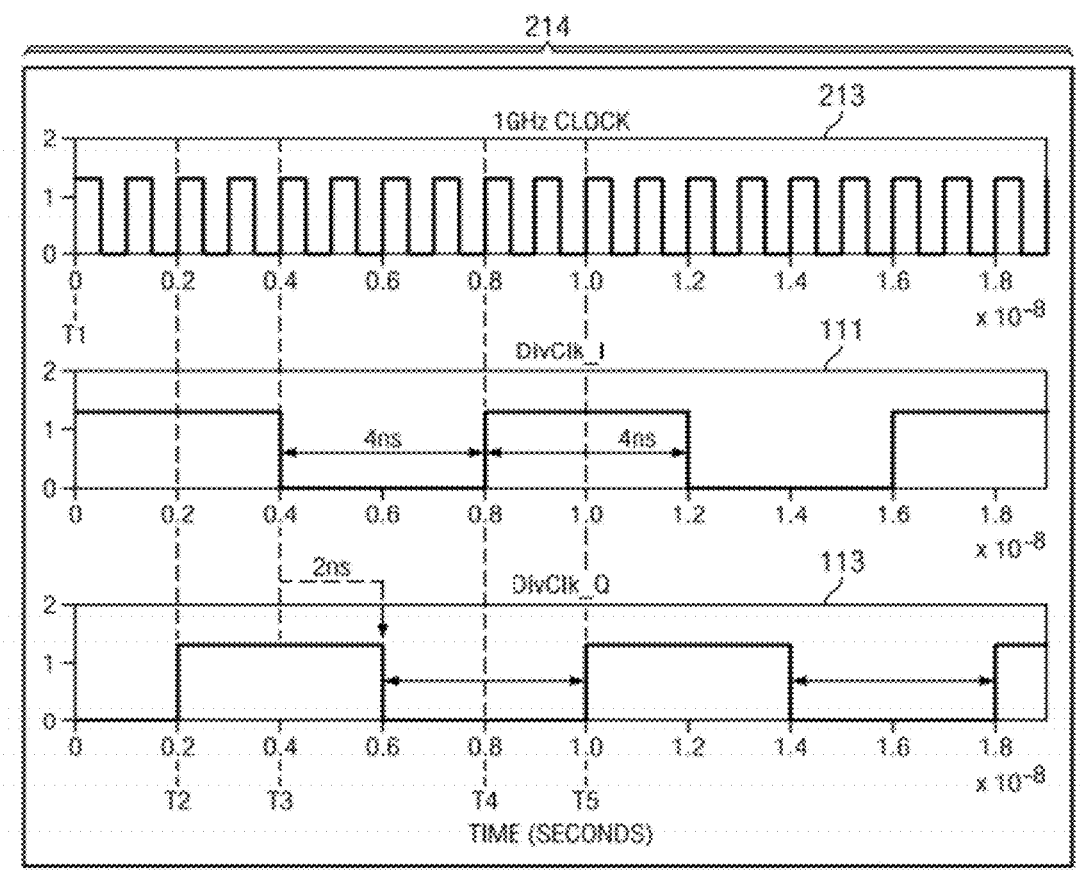
FIG. 4 illustrates waveforms associated with an output divider.

In this example, frequency divider 500 is capable of dividing at integers 9, 10, 11, 12, 13, and 14. The additional odd divisors allow DCO 212 to operate at a smaller tuning range of 900 to 1000 MHz while still allowing FM synthesizer 108 to operate over a range of 65 to 110 MHz. Output in frequency band 808 (65 to 70 MHz) may use an integer divider of 14. Output in frequency band 810 (70 to 75 MHz) may use an integer divider of 13. Output in frequency band 812 (75 to 82 MHz) may use an integer divider of 12. Output in frequency band 814 (82 to 90 MHz) may use an integer divider of 11. Output in frequency band 816 (90 to 100 MHz) may use an integer divider of 10. Output in frequency band 818 (100 to 110 MHz) may use an integer divider of 9. The maximum range of frequencies required by DCO 212 is 900 to 1000 MHz, which requires a capacitance change of about 20% when, upon a change in required output frequency of FM synthesizer 108, the output frequency of DCO 212 must change from 900 MHz to 1000 MHz or 1000 MHz to 900 MHz. Reducing the required capacitance change from 40% to 20% is a significant improvement compared to the conventional methods discussed above with reference to FIG. 3.

By adding odd integers to frequency divider 500, the required tuning range of DCO 212 is also reduced. Accordingly, the required change in capacitance corresponding to frequencies over the tuning range of DCO 212 is reduced.

Ideally in-phase clock signal 111 and quadrature-phase clock signal 113 should be 90° out of phase. In accordance with an example embodiment of the present invention in-phase clock signal 111 and quadrature-phase clock signal 113 are generated with a maximum phase error=0.25 of clock signal 213 (about 0.25 ns).

In accordance with aspects of the present invention, example methods are provided correct for this non-ideal phase relationship between in-phase clock signal 111 and quadrature-phase clock signal 113.

A first example method to correct for this non-ideal phase relationship between in-phase clock signal 111 and quadrature-phase clock signal 113, the residual 0.25 cycle phase error is digitally corrected. In an example embodiment, the digital correction is performed by DSP 126.

In another example method, this non-ideal phase relationship between in-phase clock signal 111 and quadrature-phase clock signal 113 is corrected in the analog by generating a delay close to 0.25 so that the IQ phase error is much less than 0.25 (for example it may be reduced from 0.25 to 0.05) and then correcting for the smaller error in the digital. This will be described in greater detail with reference to FIG. 9.

Figure 9:
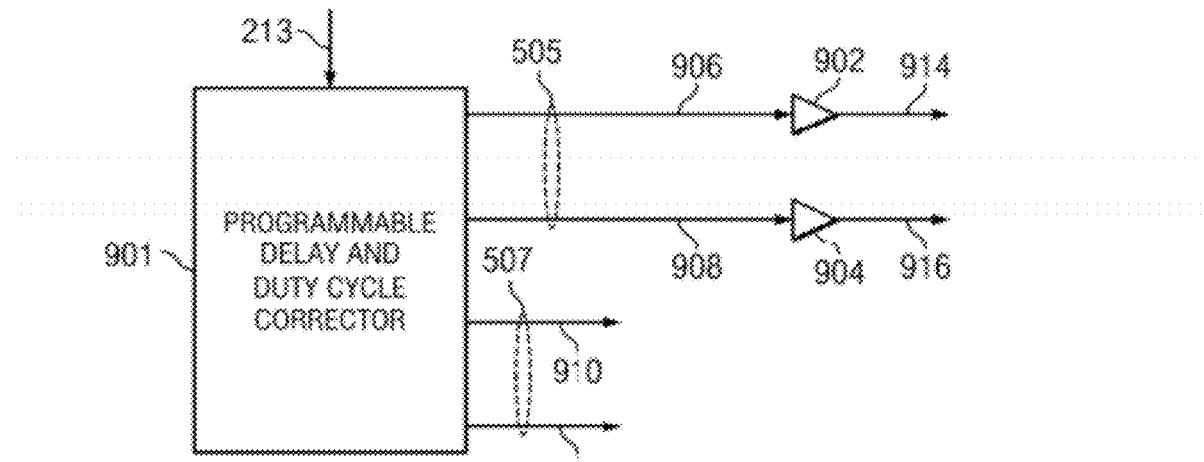
FIG. 9 illustrates an example modification to programmable delay and duty cycle corrector in accordance with an aspect of the present invention.

FIG. 9 illustrates an example modification to programmable delay 502 and duty cycle corrector 504 in accordance with an aspect of the present invention.

As illustrated in the figure, programmable delay 502 and duty cycle corrector 504 are represented as programmable delay and duty cycle corrector 901. Further, corrected Q-signal 505 includes a first corrected Q-signal 906 and a corrected compliment Q-signal 908 and corrected I-signal 507 includes a first corrected Q-signal 906 and a corrected compliment Q-signal 908. In this example, first corrected Q-signal 906 and a corrected compliment Q-signal 908 are provided to a first delay element 902 and a second delay element 904, respectively. First delay element 902 outputs a delayed corrected O-signal 914, whereas second delay element 904 outputs a delayed corrected compliment Q-signal 916.

Take for example, a situation where the frequency of clock signal 213 is 1 GHz, and the integer value of output divider 214 is 9. In such a case, ideally the edges of I-signal 507 have to be delayed by 2.25 cycles of clock signal 213 to generate Q-signal 505. In this example, presume that programmable delay and duty cycle corrector 901 only delays Q-signal 505 by 2 cycles of clock signal 213. Each of first delay element 902 and second delay element 904 may be added to provide a delay of approximately 0.2 cycles of clock signal 213 in the analog to minimize this non-ideality. In accordance with this example aspect. DSP 126 will only be required to correct a smaller non-ideality.

In another example method, this non-ideal phase relationship between in-phase clock signal 111 and quadrature-phase clock signal 113 is corrected in the analog by generating a 0.25 cycle delay in clock signal 213 using a delay lock loop. This will be described in greater detail with reference to FIG. 10.

Figure 10:
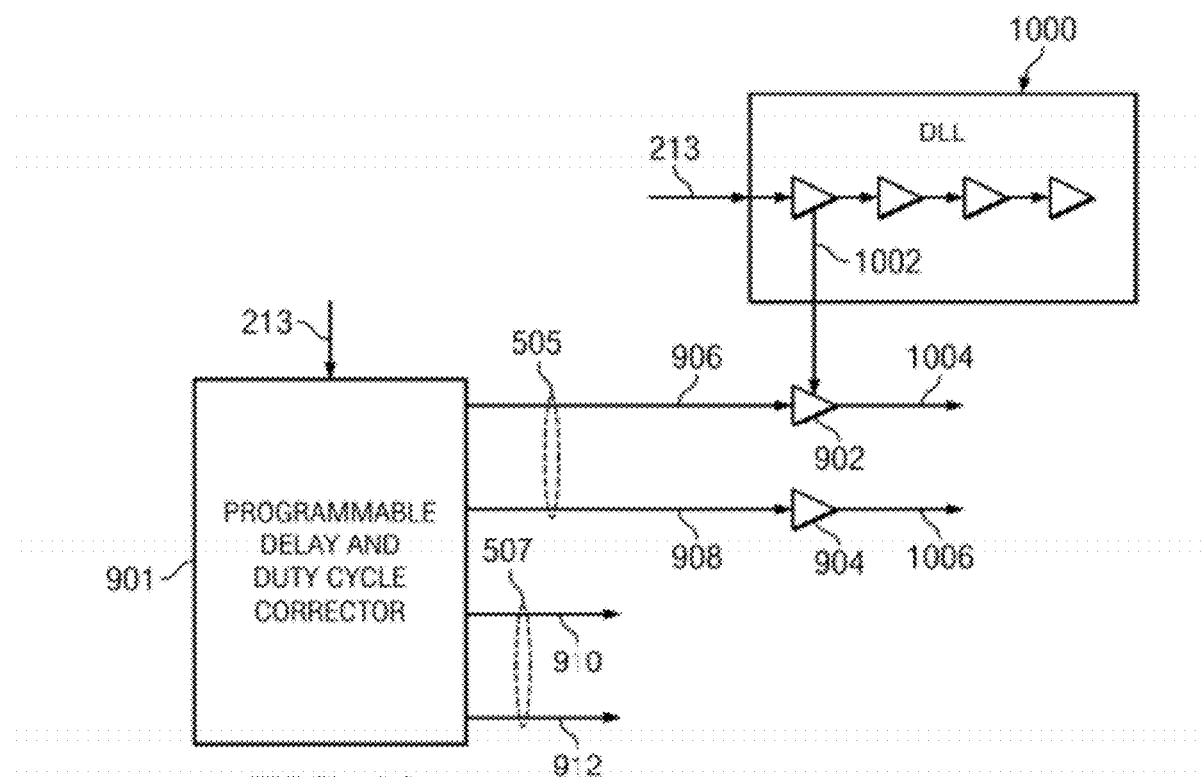
FIG. 10 illustrates another example modification to programmable delay and duty cycle corrector in accordance with an aspect of the present invention.

FIG. 10 illustrates another example modification to programmable delay and duty cycle corrector 901 in accordance with an aspect of the present invention.

This example modification is similar to that discussed above with reference to FIG. 9, but further includes a delayed lock loop (DLL) 1000. In this example, DLL is arranged to receive clock signal 213 and to output a delayed signal 1002. First delay element 902 and second delay element 904 are arranged to receive delayed signal 1002.

Again, take for example, a situation where the frequency of clock signal 213 is 1 GHz, and the integer value of output divider 214 is 9. In such a case, ideally the edges of I-signal 507 have to be delayed by 2.25 cycles of clock signal 213 to generate Q-signal 505. In this example, presume that programmable delay and duty cycle corrector 901 only delays Q-signal 505 by 2 cycles of clock signal 213. In this example, delayed lock loop (DLL) 1000 is operable to provide a very well controlled delay of 0.25 in clock signal 213 in the analog to eliminate this non-ideality.

The foregoing description of various embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A device for use with a clock signal, said device comprising:
   a divider arranged to receive the clock signal, operable to divide the clock signal and to output a divided clock signal;
   a delay portion operable to output a delayed signal based on the divided clock signal; and
   a duty cycle corrector operable to output a first signal based on the delayed signal and the divided clock signal;
   wherein said duty cycle corrector comprises an inverter, a first delay unit, a second delay unit and an AND gate;
   wherein said inverter is arranged to receive the clock signal and operable to output an inverted signal,
   wherein said first delay unit is arranged to receive the divided clock signal and the clock signal and to output a first delay signal,
   wherein said second delay unit is arranged to receive the divided clock signal and the inverted signal and to output a second delay signal, and
   wherein said AND gate is arranged to receive the first delay signal and the second delay signal and to output the first signal.

2. The device of claim 1, wherein said delay portion is operable to output the delayed signal further based on the clock signal.

3. The device of claim 2, wherein said duty cycle corrector is operable to output the first signal further based on the clock signal.

4. The device of claim 1, wherein said duty cycle corrector is operable to output the first signal further based on the clock signal.

5. The device of claim 1,
   wherein said duty cycle corrector is further operable to output a first complement signal, and
   wherein the first complement signal is a complement of the first signal.

6. The device of claim 5,
   wherein said duty cycle corrector is further operable to output a second signal, and
   wherein the second signal is 90° out of phase with the first signal.

7. The device of claim 1, wherein said divider is operable to divide the clock signal by an odd integer.

8. A method of processing a clock signal, said method comprising:
   dividing, via a divider, the clock signal;
   delaying, via a delay, operable to output a delayed signal based on the divided clock signal; and
   a duty cycle corrector operable to output a first signal based on the delayed signal and the divided clock signal;
   wherein said duty cycle corrector comprises an inverter, a first delay, a second delay and an AND gate;
   wherein said inverter is arranged to receive the clock signal and operable to output an inverted signal,
   wherein said first delay is arranged to receive the divided clock signal and the clock signal and to output a first delay signal,
   wherein said second delay is arranged to receive the divided clock signal and the inverted signal and to output a second delay signal, and
   wherein said AND gate is arranged to receive the first delay signal and the second delay signal and to output the first signal.

9. The method of claim 8, wherein said programmable delay is operable to output the delayed signal further based on the clock signal.

10. The method of claim 9, wherein said duty cycle corrector is operable to output the first signal further based on the clock signal.

11. The method of claim 8, wherein said duty cycle corrector is operable to output the first signal further based on the clock signal.

12. The method of claim 8,
   wherein said duty cycle corrector is further operable to output a first complement signal, and
   wherein the first complement signal is a complement of the first signal.

13. The method of claim 12,
wherein said duty cycle corrector is further operable to output a second signal, and
wherein the second signal is 90° out of phase with the first signal.

14. The method of claim 13,
wherein said duty cycle corrector is further operable to output a second complement signal, and
wherein the second complement signal is a complement of the second signal.

15. The method of claim 8, wherein said divider is operable to divide the clock signal by an odd integer.

* * * * *